(12) United States Patent
Ito et al.

(10) Patent No.: US 7,176,471 B2
(45) Date of Patent: Feb. 13, 2007

(54) ELECTRON BEAM EXPOSURE METHOD AND ELECTRON BEAM EXPOSURE APPARATUS

(75) Inventors: Eiichi Ito, Nishinomiya (JP); Masahiko Tsukuda, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 37 days.

(21) Appl. No.: 10/528,548

(22) PCT Filed: Oct. 24, 2003

(86) PCT No.: PCT/JP03/13599

§ 371 (c)(1),
(2), (4) Date: Mar. 21, 2005

(87) PCT Pub. No.: WO2004/038508

PCT Pub. Date: May 6, 2004

(65) Prior Publication Data

US 2006/0108542 A1    May 25, 2006

(30) Foreign Application Priority Data

Oct. 28, 2002  (JP) ............................. 2002-312434

(51) Int. Cl.
*G21K 5/10* (2006.01)
*H01J 37/08* (2006.01)
*G11B 9/10* (2006.01)

(52) U.S. Cl. .................................. 250/492.22; 369/101
(58) Field of Classification Search ........... 250/492.22; 430/296, 619, 215, 505
See application file for complete search history.

(56) References Cited

U.S. PATENT DOCUMENTS

| | | | | |
|---|---|---|---|---|
| 5,279,925 A | * | 1/1994 | Berger et al. | 430/296 |
| 5,382,498 A | * | 1/1995 | Berger | 430/296 |
| 5,614,725 A | * | 3/1997 | Oae et al. | 250/492.22 |
| 5,920,077 A | * | 7/1999 | Oae et al. | 250/492.22 |
| 6,069,684 A | * | 5/2000 | Golladay et al. | 355/53 |
| 6,118,129 A | * | 9/2000 | Oae et al. | 250/492.22 |
| 6,307,826 B1 | * | 10/2001 | Katsumura et al. | 369/101 |
| 6,901,314 B2 | * | 5/2005 | Mitsui et al. | 700/245 |
| 2003/0025088 A1 | * | 2/2003 | Oae et al. | 250/492.23 |
| 2004/0170921 A1 | * | 9/2004 | Katsumura | 430/271.1 |
| 2004/0190394 A1 | * | 9/2004 | Hattori et al. | 369/30.03 |
| 2005/0112477 A1 | * | 5/2005 | Yoshikawa et al. | 430/5 |

FOREIGN PATENT DOCUMENTS

JP    52-117547    10/1977

(Continued)

OTHER PUBLICATIONS

International Search Report corresponding to application No. PCT/JP03/13599 dated Feb. 3, 2004.

*Primary Examiner*—Nikita Wells
*Assistant Examiner*—Johnnie L Smith, II
(74) *Attorney, Agent, or Firm*—RatnerPrestia

(57) ABSTRACT

In an electron beam exposure method in which an article subjected to exposure and an electron beam irradiation spot are moved relative to each other at a continuous speed, the article is exposed at a plurality of irradiation intensities of an electron beam by changing a transmittance of an electron optical system for forming the electron beam irradiation spot on the article.

11 Claims, 12 Drawing Sheets

FOREIGN PATENT DOCUMENTS

| | | |
|---|---|---|
| JP | 2-237106 | 9/1990 |
| JP | 9-205051 | 8/1997 |
| JP | 11-288535 | 10/1999 |
| JP | 2002-287371 | 10/2002 |
| JP | 2003-51437 | 2/2003 |
| JP | 2003-332217 | 11/2003 |

* cited by examiner

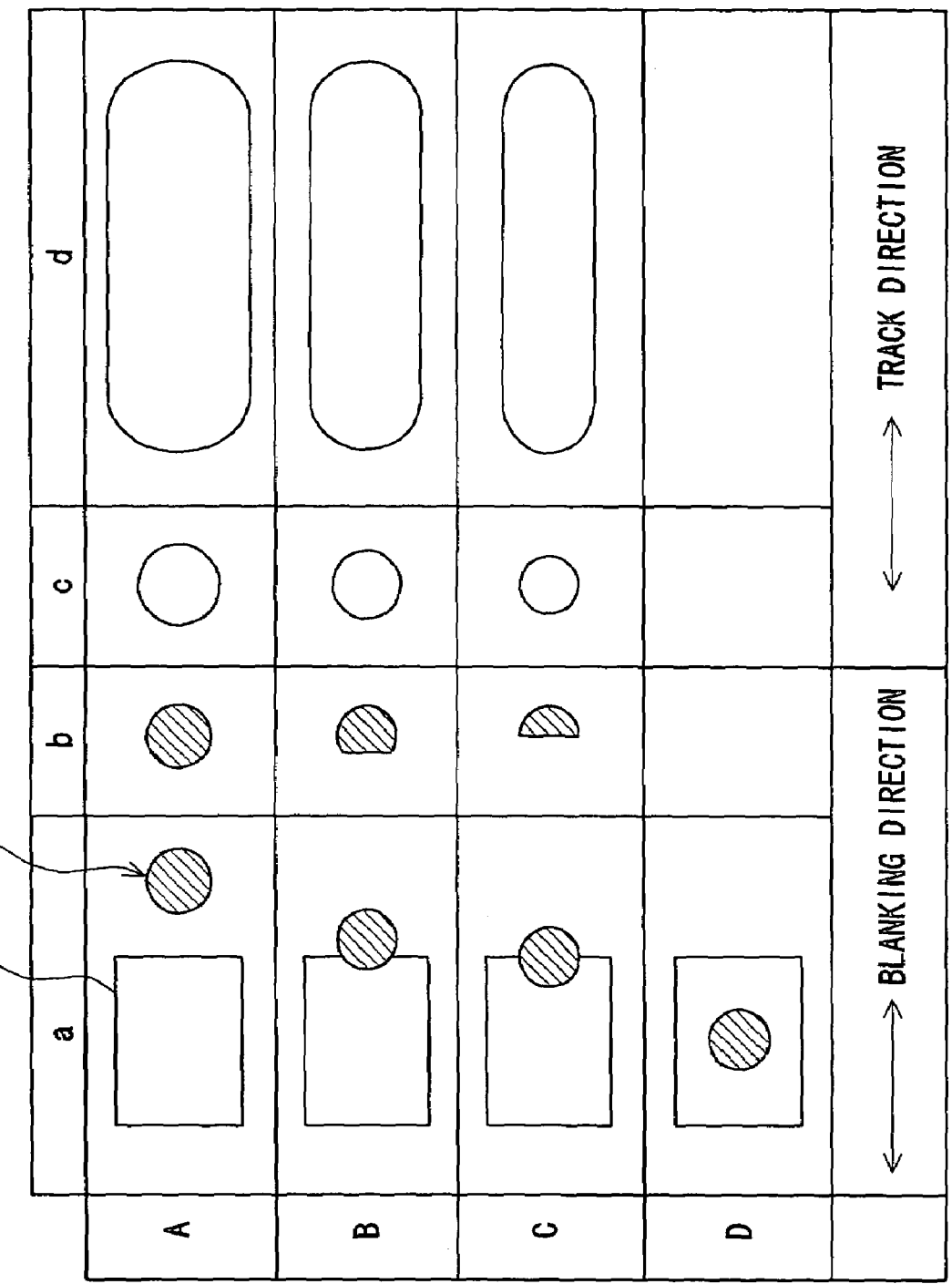

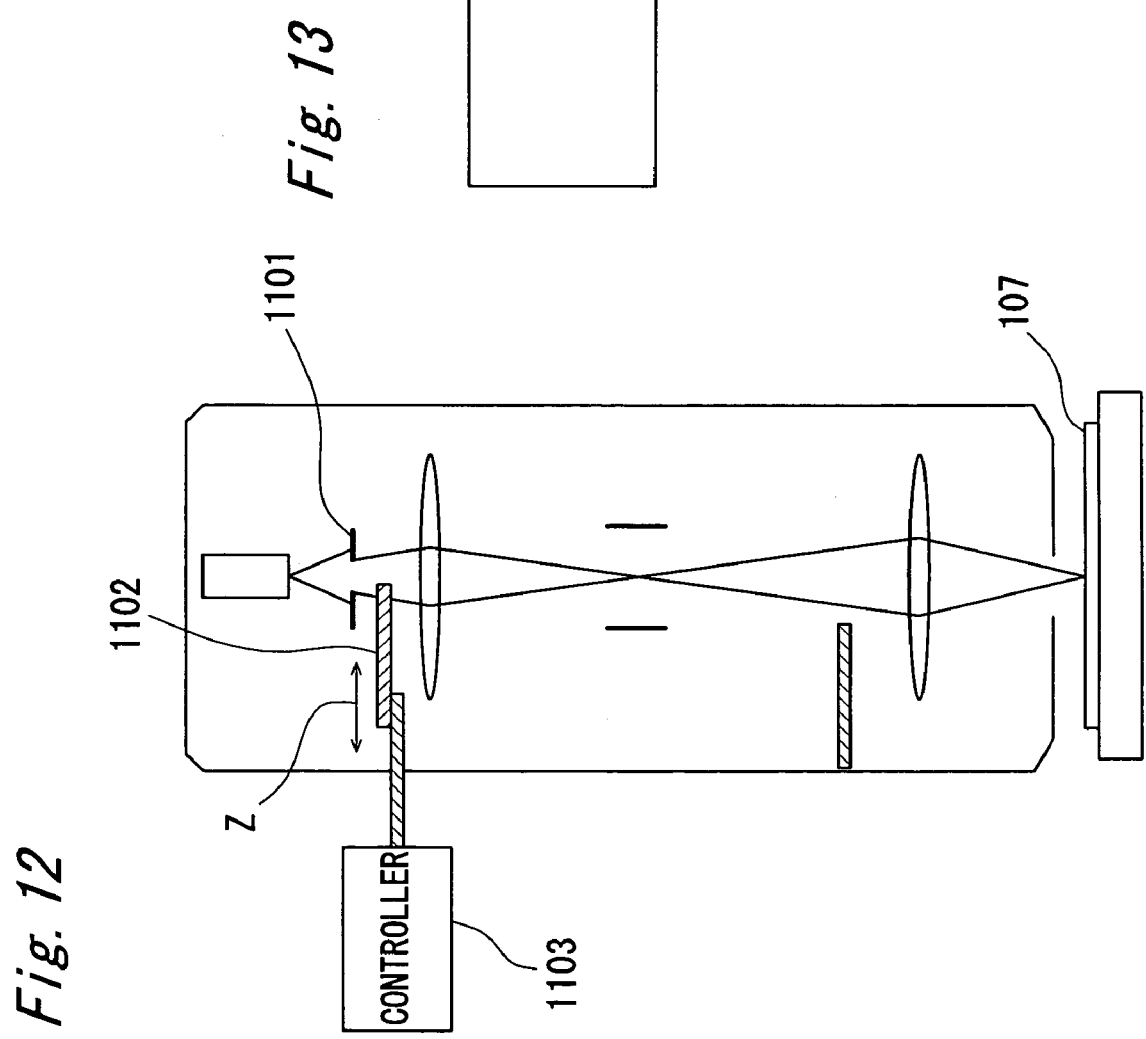

ELECTRON BEAM EXPOSURE METHOD AND ELECTRON BEAM EXPOSURE APPARATUS

THIS APPLICATION IS A U.S. NATIONAL PHASE APPLICATION OF PCT INTERNATIONAL APPLICATION PCT/JP2003/013599.

1. Technical Field

The present invention relates to electron beam exposure in which an article subjected to exposure and an electron beam irradiation spot are moved relative to each other at a continuous speed, for example, manufacture of an optical information recording medium or a magnetic disc.

2. Background Art

Recording of a master of an optical information recording medium is described as one example of conventional electron beam exposure in which an article subjected to exposure and an electron beam irradiation spot are moved relative to each other at a continuous speed. In order to perform recording of the master of the optical information recording medium, such a technique has long been employed in which a resist is coated on the master, the resist is exposed by a laser and a pattern of information pits, etc. is formed through development of the master. However, recently, such a procedure that the resist is exposed by an electron beam having condensibility far higher than that of the laser has come into use upon progress of miniaturization of the information pits in response to increase of a recording density of an optical information recording medium of 12 cm in diameter to 25 to 50 GB.

Hereinafter, a prior art electron beam exposure apparatus used for performing recording of the master of the optical information recording medium is described with reference to FIG. 14. An electron beam emitted from an emitter 1201 is shaped by an aperture 1202 and then, is converged by a lens 1203. A blanking deflector 1204 is capable of deflecting the converged electron beam. The deflected electron beam hits a blanking mask 1205 as shown by the broken lines and thus, is not delivered to a recording master 1207 as described in, for example, Japanese Patent Laid-Open Publication No. 11-288535 (1999). On the other hand, the electron beam which has not been deflected by the blanking deflector 1204 is further converged onto the recording master 1207 by a lens 1206. The recording master 1207 is placed on a rotary stage 1208 which is coupled with a rotary motor 1210 via a rotary shaft 1209. The rotary motor 1210 is, in turn, mounted on a slider 1211 so as to be moved horizontally by the slider 1211. Meanwhile, these members 1201 to 1211 are hermetically isolated from exterior by a column 1212 and a chamber 1213 so as to be placed under vacuum.

In the prior art electron beam exposure apparatus of the above described construction, an information signal pattern is formed by turning on or off irradiation of the electron beam through the blanking deflector 1204. Since the recording master 1207 not only is rotated together with the rotary stage 1208 by the rotary motor 1210 but is moved horizontally by the slider 1211, the electron beam controlled by the blanking deflector 1204 can be irradiated over the recording master 1207 spirally.

In the prior art electron beam exposure apparatus, even if the blanking mask is formed by an aperture as described in, for example, the above mentioned prior art Japanese publication or an edged member or the lenses and the blanking mask may be different, in number and location, from those of FIG. 14, the same control principle as described above is applied to electron beam irradiation.

By employing the prior art electron beam exposure apparatus referred to above, it is possible to perform exposure of a pattern far more minute than that of recording of the master by the laser.

In the prior art electron beam exposure apparatus, since only either one of an irradiated state and an unirradiated state can be selected, it was impossible to perform such sophisticated exposure control as change of irradiation intensity of the electron beam in accordance with length of a pit and exposure of a groove having continuously variable width. Thus, in case a chemically amplified resist, for example, is employed for raising sensitivity of the resist, such a trend is conspicuous that a width of a longer pit subjected to irradiation of a larger quantity of electric current becomes larger, so that it is difficult to balance long pits and short pits with one another.

Meanwhile, in the prior art electron beam exposure apparatus, if irradiation intensity is constant, exposure linear velocity becomes constant. Thus, in case exposure is performed while the master on the rotary stage is being rotated, it is impossible to perform recording at a constant angular velocity (CAV).

DISCLOSURE OF INVENTION

In order to eliminate the above mentioned drawbacks of prior art, a first electron beam exposure method of the present invention is characterized in that in electron beam exposure in which an article subjected to exposure and an electron beam irradiation spot are moved relative to each other at a continuous speed, a transmittance of an electron optical system is changed by changing a state of hitting of a blanking mask by an electron beam through control of a direction of deflection of the electron beam by a blanking deflector or displacement of a blanking mask.

By this electron beam exposure method of the present invention, recording can be performed at a constant angular velocity by controlling a pit width of each pit through control of an irradiation intensity of the electron beam in accordance with a pit length or by controlling the irradiation intensity of the electron beam in accordance with an exposure radius of a recording master. The above mentioned relative motion between the article and the electron beam irradiation spot includes rotary motion.

Meanwhile, a second electron beam exposure method of the present invention is characterized in that in electron beam exposure in which an article subjected to exposure and an electron beam irradiation spot are moved relative to each other at a continuous speed, a transmittance of an electron optical system is changed by changing a state of hitting of a blanking mask having a plurality of transmission shapes by an electron beam through control of a direction of deflection of the electron beam by a blanking deflector or displacement of a blanking mask.

By this electron beam exposure method of the present invention, recording can be performed at a constant angular velocity by controlling a pit width of each pit through control of an irradiation intensity of the electron beam in accordance with a pit length or by controlling the irradiation intensity of the electron beam in accordance with an exposure radius of a recording master.

Furthermore, a third electron beam exposure method of the present invention is characterized in that in electron beam exposure in which an article subjected to exposure and an electron beam irradiation spot are moved relative to each other at a continuous speed, an irradiation intensity of the electron beam is changed continuously by changing a transmission shape of an aperture continuously.

By this electron beam exposure method of the present invention, recording can be performed at a constant angular velocity by controlling the irradiation intensity of the electron beam in accordance with an exposure radius of a recording master.

In addition, in order to solve the above problems of prior art, an electron beam exposure apparatus of the present invention is characterized in that in electron beam exposure in which an article subjected to exposure and an electron beam irradiation spot are moved relative to each other at a continuous speed, an electron optical system for forming the electron beam irradiation spot on the article and a blanking means for changing a transmittance of the electron optical system such that the article is exposed at a plurality of irradiation intensities of the electron beam by the electron optical system are provided.

By this electron beam exposure apparatus of the present invention, recording can be performed at a constant angular velocity by controlling a pit width of each pit through control of an irradiation intensity of the electron beam in accordance with a pit length or by controlling the irradiation intensity of the electron beam in accordance with an exposure radius of a recording master.

BRIEF DESCRIPTION OF DRAWINGS

FIG. 2 is a view explanatory of a blanking process of a blanking mask employed in the electron beam exposure apparatus of FIG. 1.

FIG. 12 is a schematic sectional view showing an electron beam exposure apparatus which is a second modification of the electron beam exposure apparatus of FIG. 9.

FIG. 13 is an enlarged top plan view showing a movable aperture employed in the electron beam exposure apparatus of FIG. 12.

BEST MODE FOR CARRYING OUT THE INVENTION

Hereinafter, embodiments of the present invention are described with reference to the drawings. A construction of an electron beam exposure apparatus is described with reference to FIG. 1. The present invention is mainly directed to operation of a blanking mechanism for performing on-off control of irradiation of an electron beam and an electron beam shaping mechanism. Thus, for example, layout or the number of converging lenses, a stage for supporting a master of an optical information recording medium, etc., which are not relevant to the blanking mechanism or the electron beam shaping mechanism, are not restricted to those shown in FIG. 1. Furthermore, if applicable to the present invention, even the blanking mechanism and the electron beam shaping mechanism are not restricted to those shown in FIG. 1 but may be modified arbitrarily.

(First Embodiment)

Figure 1:
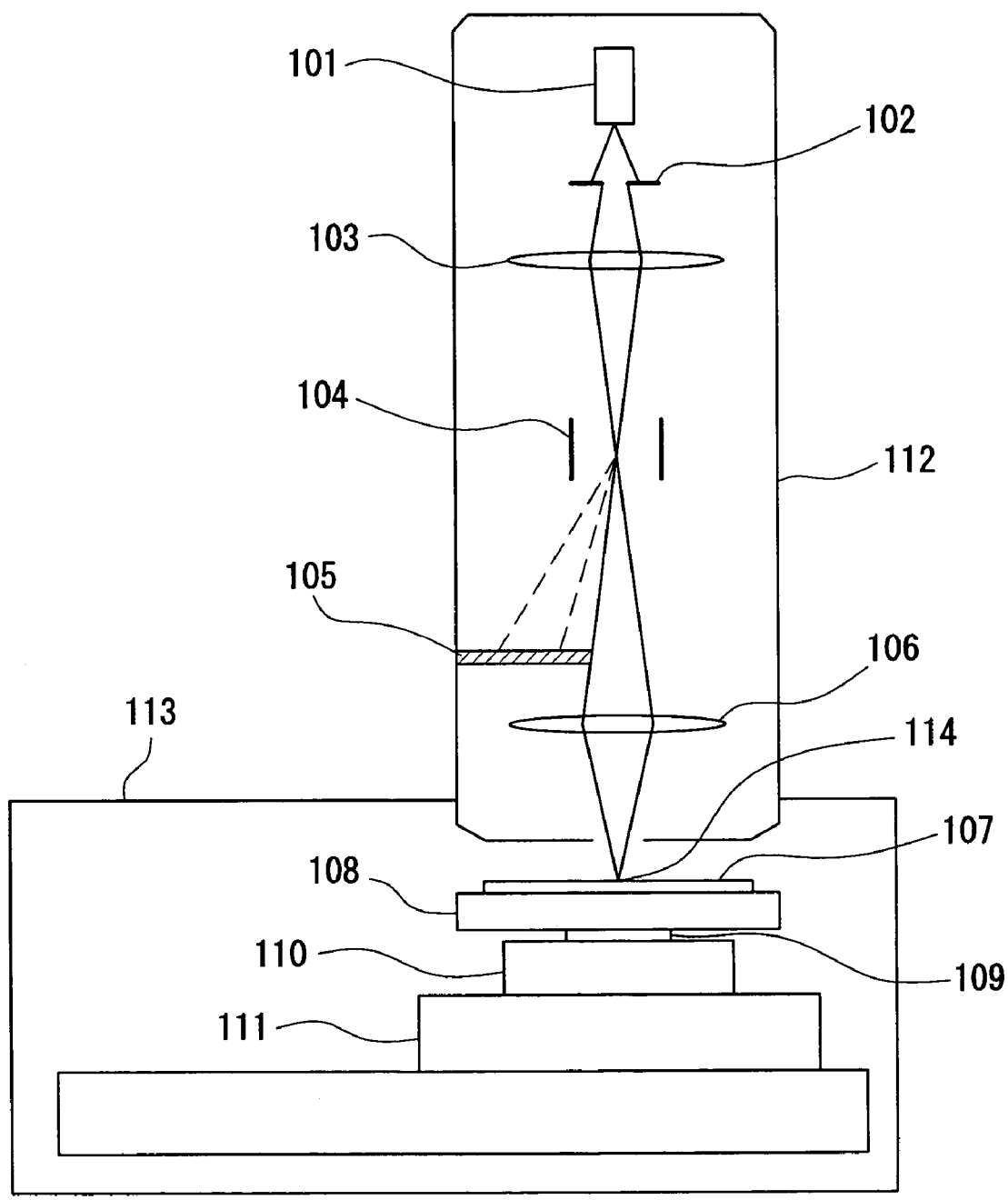
FIG. 1 is a schematic sectional view showing an electron beam exposure apparatus according to a first embodiment of the present invention.

FIG. 1 shows an electron beam exposure apparatus according to a first embodiment of the present invention. The electron beam exposure apparatus of FIG. 1 is used for spiral exposure. This electron beam exposure apparatus is used for spiral exposure on a recording master 107. In FIG. 1, an electron beam emitted from an emitter 101 is shaped by an aperture 102 and then, is converged by a lens 103. A blanking deflector 104 is capable of deflecting the converged electron beam such that a state in which the electron beam hits a blanking mask 105 is controlled by a deflection direction of the electron beam. The electron beam which has not been intercepted by the blanking mask 105 is further converged onto the recording master 107 by a lens 106 so as to form an irradiation spot 114 on the recording master 107. The recording master 107 is placed on a rotary stage 108 which is coupled with a rotary motor 110 via a rotary shaft 109. The rotary motor 110 is, in turn, mounted on a slider 111 so as to be moved horizontally by the slider 111. Meanwhile, these members 101 to 111 are hermetically isolated from exterior by a column 112 and a chamber 113 so as to be placed under vacuum.

In FIG. 2 showing exposure in a method of the present invention, a column "a" illustrates states of hit of the blanking mask 105 by the electron beam, a column "b" illustrates shapes of the electron beam transmitted through the blanking mask 105, a column "c" illustrates shapes of a "shortest pit" obtained after development and a column "d" illustrates shapes of a "long pit" obtained after development. Here, the term "shortest pit" denotes a pit in which a length in a direction parallel to a track of the pit is substantially identical with a radial length of the pit. Meanwhile, the term "long pit" denotes a pit having a width identical with that of a groove formed by exposure at an identical exposure intensity and development. In FIG. 2, rows "A" to "D" illustrate changes of deflection state of the electron beam. Since the electron beam is once converged at the position of the blanking deflector 104, an electron optical system is obtained in which the electron beam is converged at an identical position by the lens 106 even if the electron beam is deflected differently by the blanking deflector 104.

In prior art, the electron beam has two deflection states, i.e., a deflection state corresponding to total irradiation of the electron beam as shown by the row "A" of FIG. 2 and a deflection state corresponding to non-irradiation of the electron beam as shown by the row "D" of FIG. 2. Since the electron beam is irradiated at an identical intensity as shown by the row "A" of FIG. 2, the longer pit tends to become wider as will be seen from relation between the shortest pit of the column "c" in the row "A" of FIG. 2 and the long pit of the column "d" in the row "A" of FIG. 2, so that it is difficult to form the pit train having excellent signal characteristics. This width change between the short and long pits becomes especially conspicuous in a chemically amplified resist employed for gaining high sensitivity.

In the method of the present invention, the electron beam has not less than three deflection states, for example, a deflection state in which the electron beam hits the blanking mask 105 partially as shown by the row "B" or the row "C" of FIG. 2, in addition to the above two deflection states of prior art. By this feature, electron beam exposure can be performed at a plurality of irradiation intensities. In this method, if, for example, the shortest pit of the column "c" in the row "A" of FIG. 2 is combined with the long pit of the column "d" in the row "C" of FIG. 2, a width of the shortest pit can be made identical with that of the long pit. Furthermore, in case pits longer than the shortest pit but shorter than the long pit should have an identical width, a deflection state may be employed which has an irradiation intensity interposed between that for the shortest pit and that for the long pit as shown by the row "B" of FIG. 2.

Figure 3A:
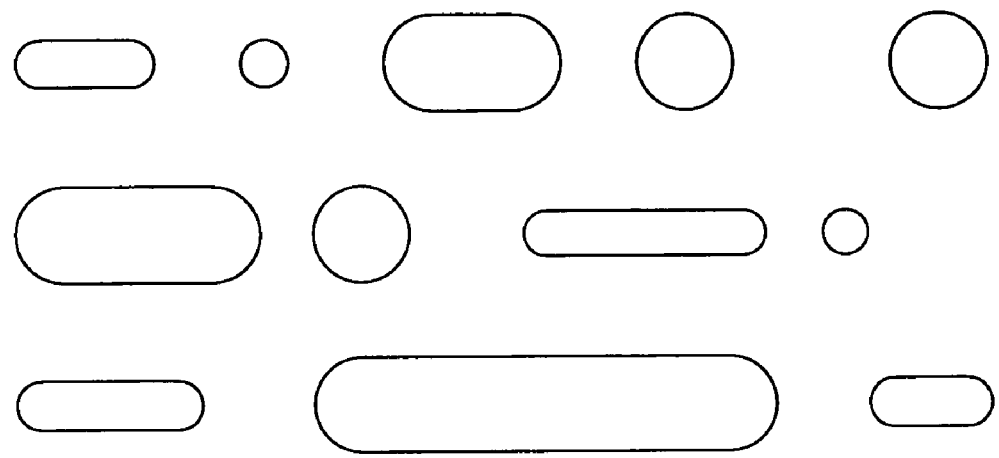
FIGS. 3A, 3B and 3C are views showing examples of a pattern formed by the electron beam exposure apparatus of FIG. 1.
Figure 3B:
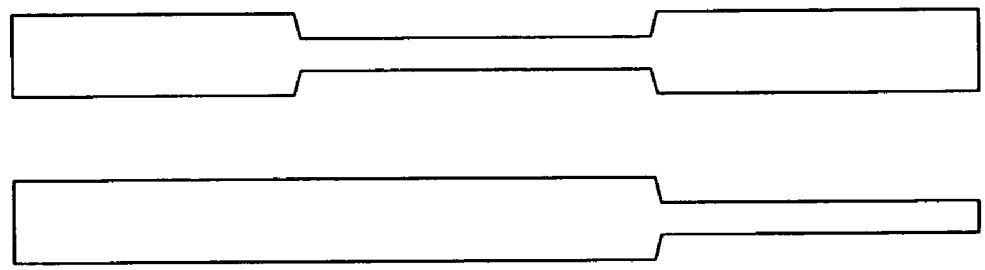
Figure 3C:
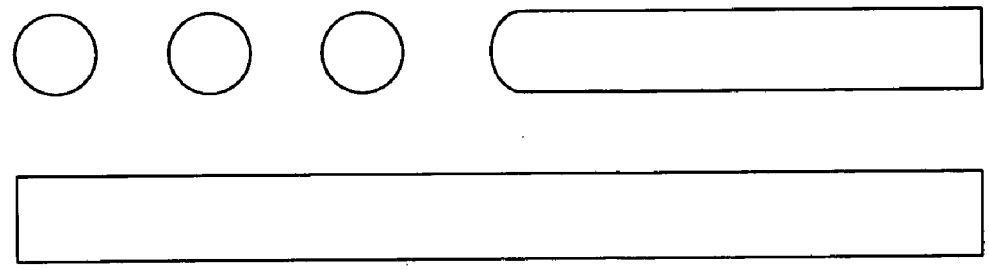

A procedure for giving an identical width to the pits having different lengths has been described above. This occupies a portion of an effect of the present invention that hitherto unavailable sophisticated electron beam exposure is made possible by controlling irradiation intensity of the electron beam arbitrarily. In the method of the present invention, information dependent on pit width can also be overwritten on conventional information recording by changing width of only specific ones of pits as shown by FIG. 3A or changing width of pits or grooves halfway as shown by FIG. 3B. Meanwhile, in case a pit train and a groove should be formed continuously, a problem that the groove becomes wider than the pit train is solved by restraining irradiation intensity for exposure of the groove, so that a width of the pit train is made identical with that of the groove as shown by FIG. 3C.

Figure 4:
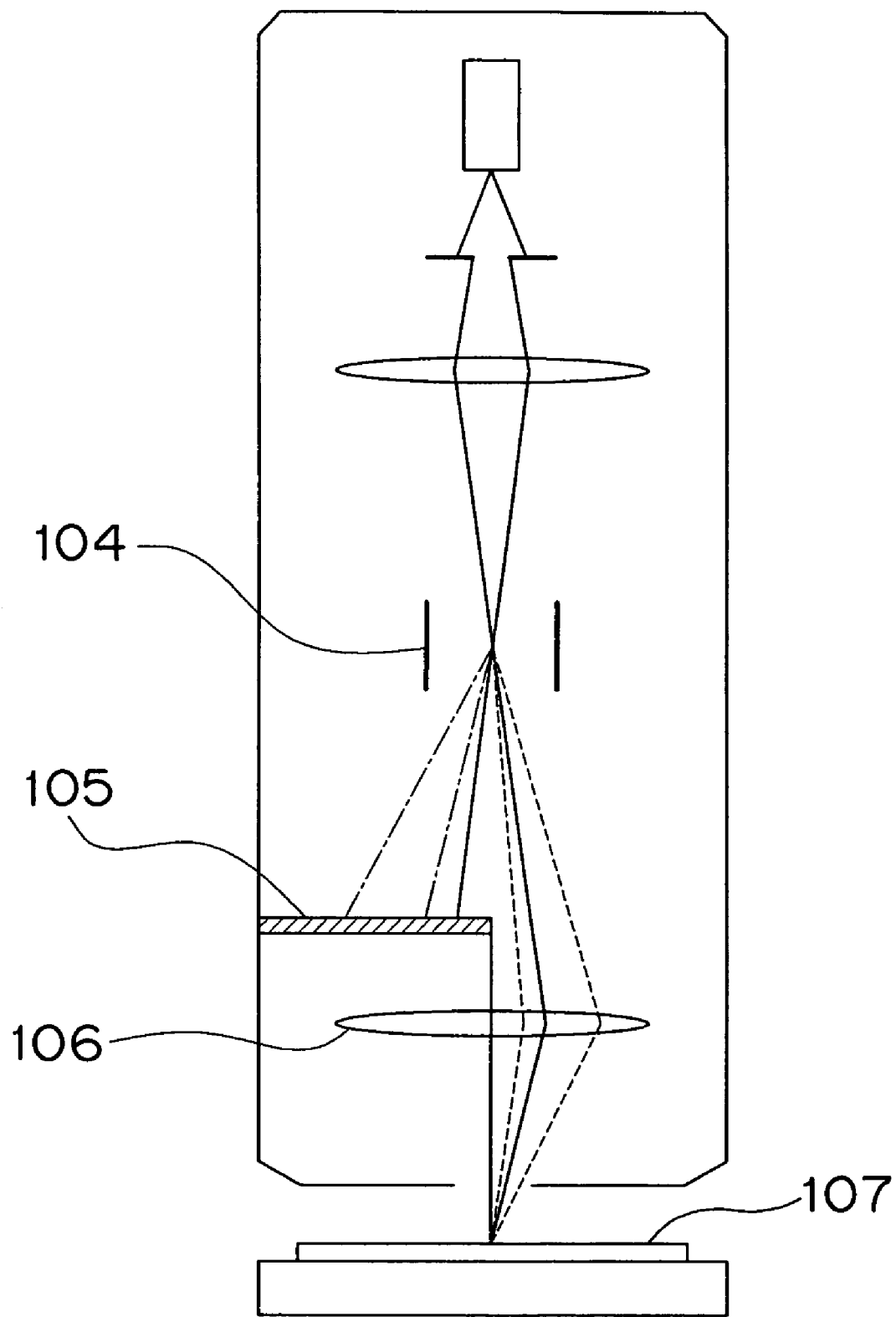
FIG. 4 is a schematic sectional view showing one example of layout of a blanking deflector and the blanking mask employed in the electron beam exposure apparatus of FIG. 1.

Meanwhile, in deflection of the electron beam, deflection direction fluctuates more or less according to performance of the blanking deflector 104. In the deflection states in which the electron beam hits the blanking mask 105 partially as shown by the row "B" or the row "C" of FIG. 2, electron beam irradiation intensity is fluctuated by this fluctuation of the deflection direction, thereby possibly resulting in scatter of shapes of the pits. In case this scatter of shapes of the pits is problematical, an arrangement shown in FIG. 4 may be employed. In FIG. 4, since a blanking mask 105 is disposed such that the electron beam hits the blanking mask 105 partially in an inoperative state of the blanking deflector 104, the electron beam can hit the blanking mask 105 partially without undergoing the fluctuation of the deflection direction as shown by the solid lines in FIG. 4. In order to set the electron beam to non-irradiation state, the electron beam may be deflected towards the blanking mask 105 as shown by the one-dot chain lines in FIG. 4. On the other hand, in order to set the electron beam to total irradiation state, the electron beam may be deflected in a direction remote from the blanking mask 105 as shown by the broken lines in FIG. 4. Fluctuation of the deflection direction indicated by the broken lines of FIG. 4 is cancelled by the lens 106, thereby posing no problem.

In this method of the present invention, it is possible to perform only one kind of partial irradiation of the electron beam. However, in case there is a largest width change between one and the subsequent one of pits having various lengths, partial irradiation and total irradiation are separately employed for the one and the subsequent one of the pits, so that the pit train having more excellent signal characteristics than prior art can be formed. Meanwhile, usually, it is effective to separately employ partial irradiation and total irradiation for the shortest pit and the second shortest pit.

Here, relation between exposure margin of the resist and the method of the present invention is considered. Exposure intensity may vary by 1 to 2% according to performance of the electron beam exposure apparatus. The resist should not be influenced by this degree of variation of exposure intensity and commercially available resists satisfy such a requirement. As a result, it is not so meaningful to perform partial irradiation different from total irradiation by 1 to 2% in the method of the present invention. In order to obtain satisfactory results in the present invention, partial irradiation should have irradiation intensity not more than 97%, preferably, not more than 95% of that of total irradiation.

By wet etching or dry etching, a pattern may be formed on the article subjected to exposure as described above.

(Second Embodiment)

Figure 5:
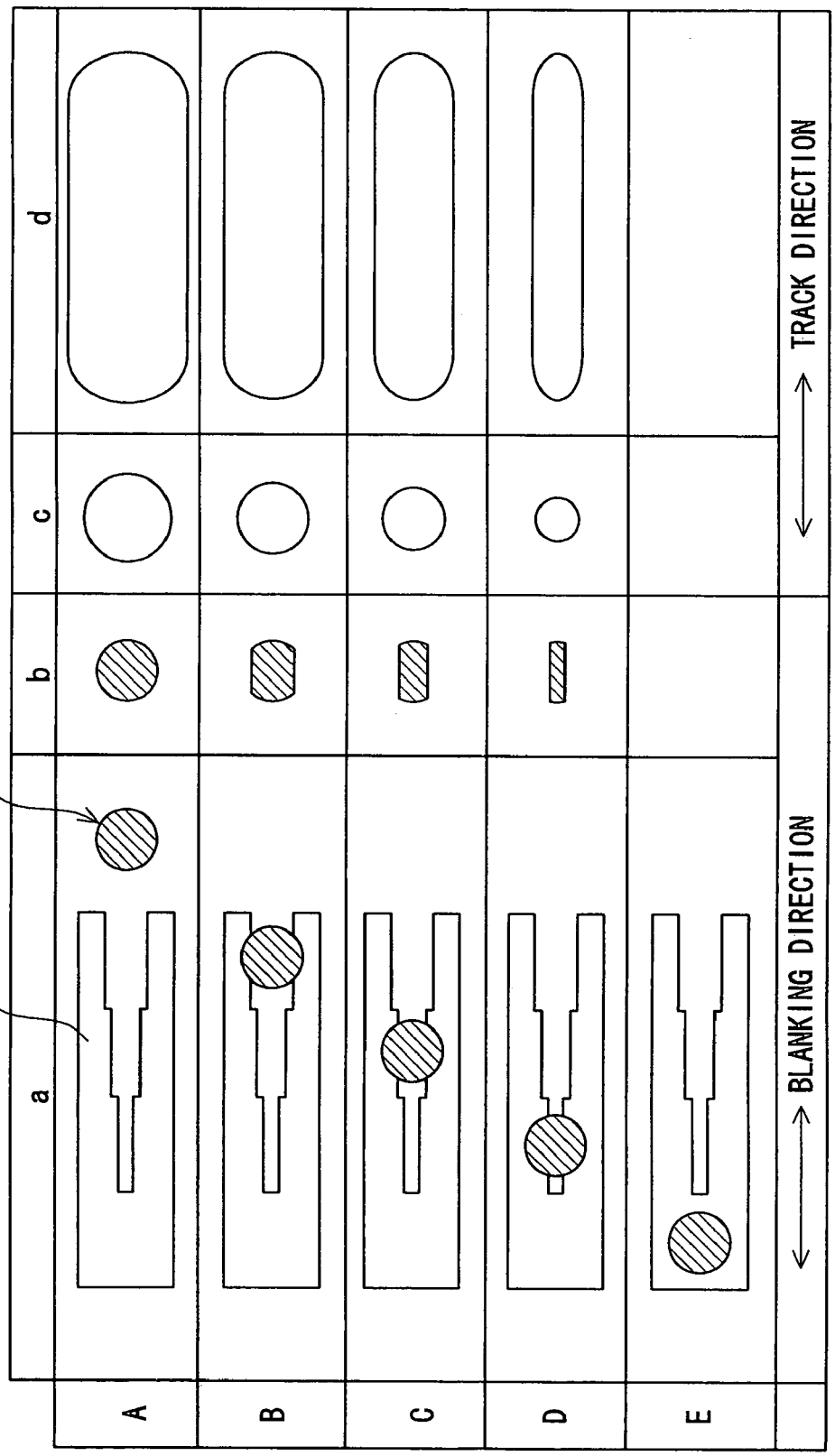
FIG. 5 is a view explanatory of a blanking process of a blanking mask employed in an electron beam exposure apparatus according to a second embodiment of the present invention.

FIG. 5 illustrates a blanking process of a blanking mask 205 of an electron beam exposure apparatus according to a second embodiment of the present invention. In FIG. 5 showing exposure in a method of the present invention, a column "a" illustrates states of hit of the blanking mask 205 by the electron beam, a column "b" illustrates shapes of the electron beam transmitted through the blanking mask 205, a column "c" illustrates shapes of a shortest pit obtained after development and a column "d" illustrates shapes of a long pit obtained after development. In FIG. 5, rows "A" to "E" illustrate changes of deflection state of the electron beam. Here, the principle of the electron beam exposure apparatus and the definitions of the "shortest pit" and the "long pit" in the first embodiment also apply to the second embodiment. Furthermore, in the second embodiment, irradiation position of the electron beam on the recording master 107 is not affected by deflection in the same manner as the first embodiment.

In the method of the present invention shown in FIG. 5, deflection states of the electron beam, which are brought about by the blanking deflector 104, are not less than three in number and irradiation intensity of the electron beam is controlled in the substantially same manner as the first embodiment. However, in the first embodiment, since shielding degree of the electron beam is controlled only in the neighborhood of an edge of the blanking mask 105, the electron beam is likely to be influenced by fluctuations of the deflection direction. On the other hand, in the method of the second embodiment, since the blanking mask 205 has a plurality of transmission shapes free from influence of the fluctuations of the deflection direction as shown in, for example, the column "a" of FIG. 5, a plurality of kinds of partial irradiation of the electron beam can be stably performed on the recording master 107 without being affected by the fluctuations of the deflection direction. If only one kind of partial irradiation is performed, exposure free from influence of the fluctuations of the deflection direction can be performed even in the method described with reference to FIG. 2 in the first embodiment.

Figure 6:
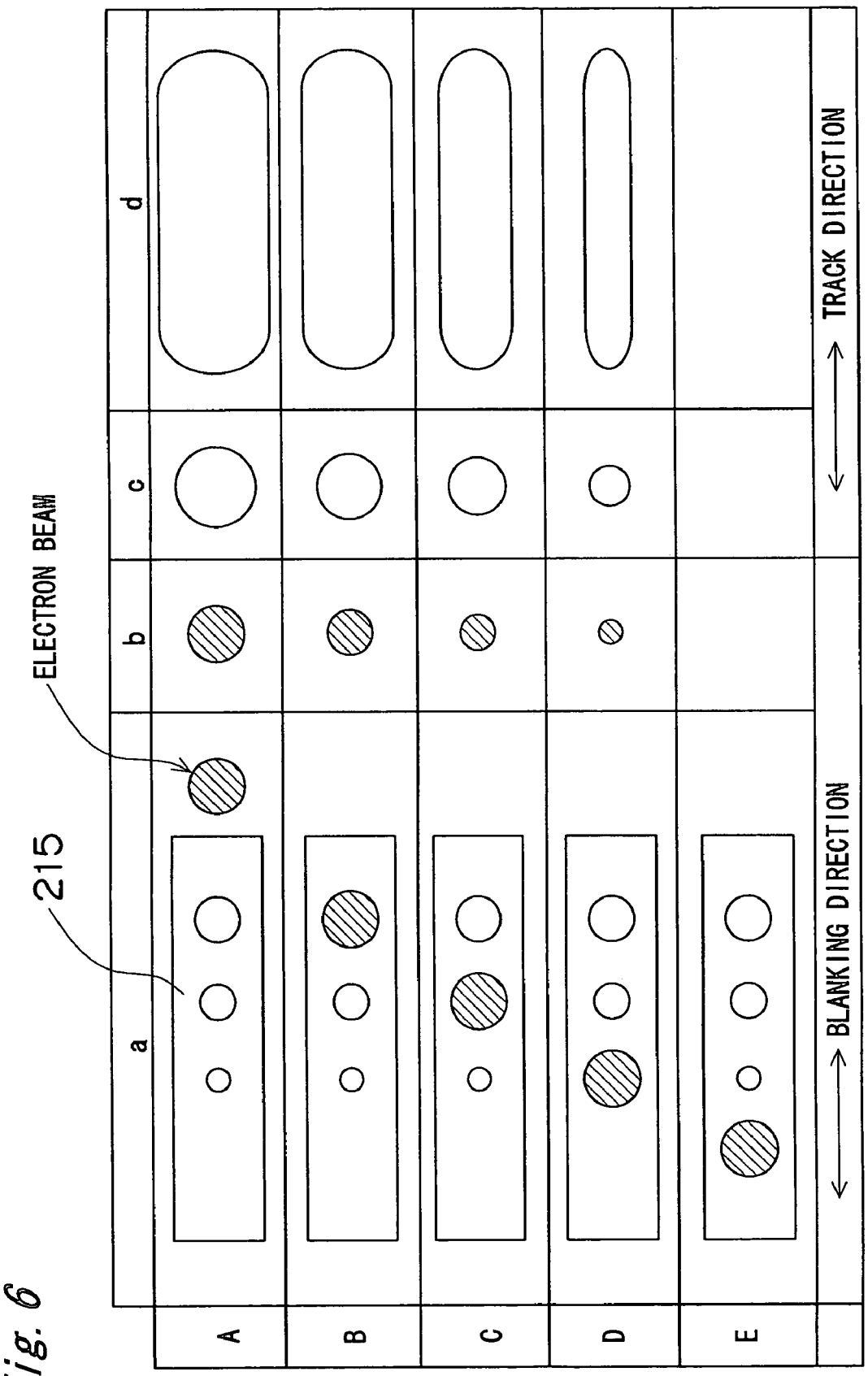
FIG. 6 is a view showing a blanking mask which is a modification of the blanking mask of FIG. 5.

In the blanking mask 205 of FIG. 5, irradiation intensity can be controlled in five stages. However, the number of the transmission shapes of the blanking mask 205 is not restricted to that shown in FIG. 5. The transmission shapes of the blanking mask 205 are not restricted to a slitlike shape shown in FIG. 5 but may be replaced by a blanking mask 215 having a plurality of circular transmission shapes of different sizes as shown in FIG. 6. Since the blanking mask 215 of FIG. 6 also has the transmission shapes free from influence of the fluctuations of the deflection direction caused by the blanking deflector 104, it is possible to perform partial irradiation of the electron beam stably. In addition, since the transmission shapes are circular at all times, such an effect is gained that a pit which is readily affected by the transmission shapes, e.g., the shortest pit can be formed more stably.

Meanwhile, in this embodiment, exposure is also not affected by fluctuations of a direction perpendicular to the deflection direction of the electron beam. However, in case fluctuations of a travel direction of the electron beam become extremely large, irradiation intensity may fluctuate slightly due to difference between electron density of a central portion of the electron beam and that of a peripheral portion of the electron beam.

(Third Embodiment)

Figure 7:
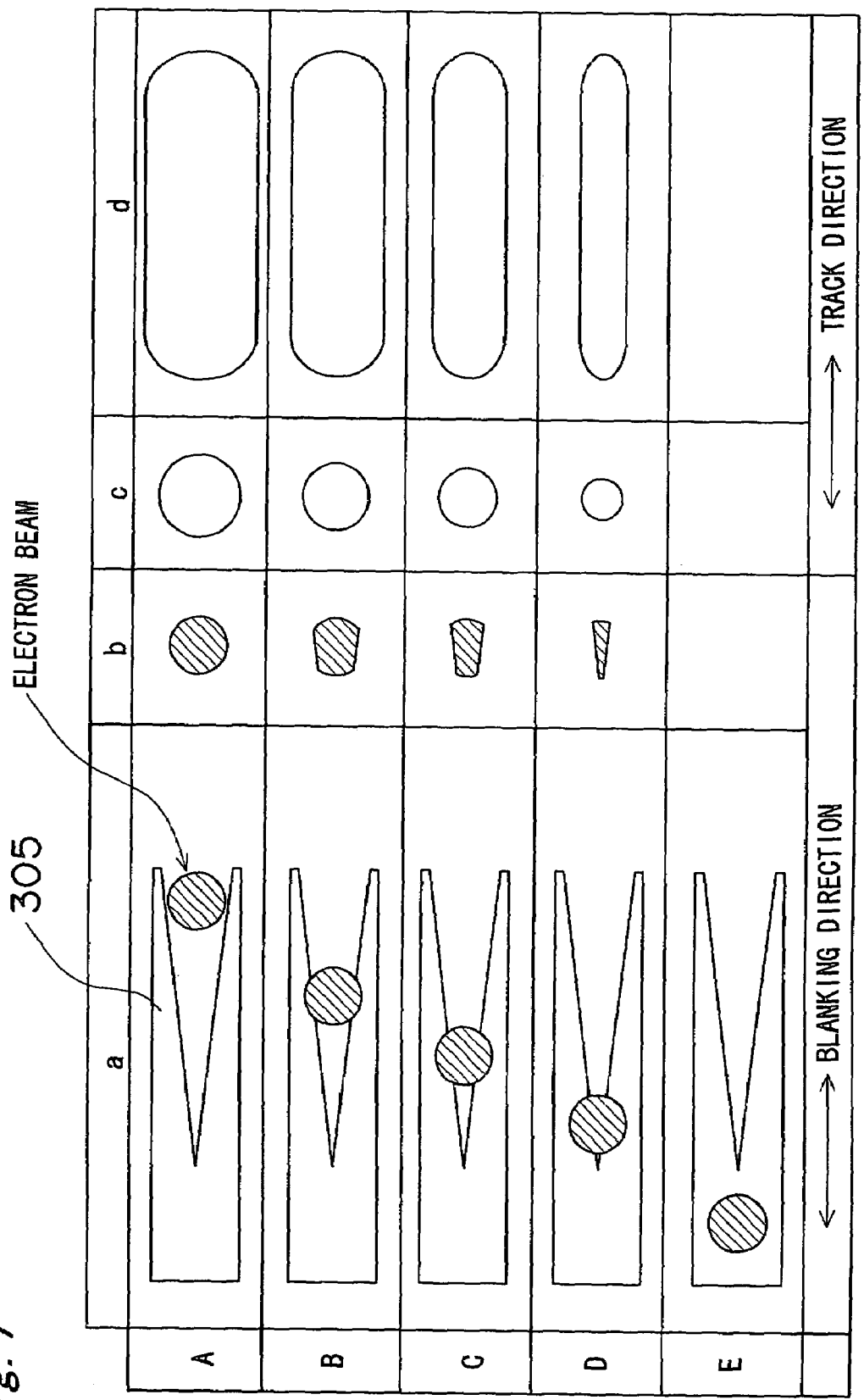
FIG. 7 is a view explanatory of a blanking process of a blanking mask employed in an electron beam exposure apparatus according to a third embodiment of the present invention.

FIG. 7 shows illustrates a blanking process of a blanking mask 305 of an electron beam exposure apparatus according to a third embodiment of the present invention. In FIG. 7 showing exposure in a method of the present invention, a column "a" illustrates states of hit of the blanking mask 305 by the electron beam, a column "b" illustrates shapes of the electron beam transmitted through the blanking mask 305, a column "c" illustrates shapes of a shortest pit obtained after development and a column "d" illustrates shapes of a long pit obtained after development. In FIG. 7, rows "A" to "E" illustrate changes of deflection state of the electron beam. Here, the principle of the electron beam exposure apparatus and the definitions of the "shortest pit" and the "long pit" in the first embodiment also apply to the third embodiment. Furthermore, in the third embodiment, irradiation position of the electron beam on the recording master 107 is not affected by deflection in the same manner as the first embodiment.

In the third embodiment, it is preferable that a blanking direction is substantially coincident with an electron beam scanning direction on the recording master 107, namely, a track direction of the optical information recording medium. In the blanking mask 305 of FIG. 7, deflection states of the electron beam, which are brought about by the blanking deflector 104, are not less than three in number and irradiation intensity of the electron beam is controlled in the substantially same manner as the first and second embodiments. However, in the method of the third embodiment, since a ratio of a change of the irradiation intensity to a change of the deflection direction is smaller than that of the method of the first embodiment, influence exerted on the irradiation intensity of the electron beam by the fluctuations of the deflection direction of the electron beam is less than that of the method of the first embodiment and the irradiation intensity can be controlled in more stages than the method of the second embodiment in which the number of the transmission shapes of the blanking masks 205 and 215 is limited.

Figure 8:
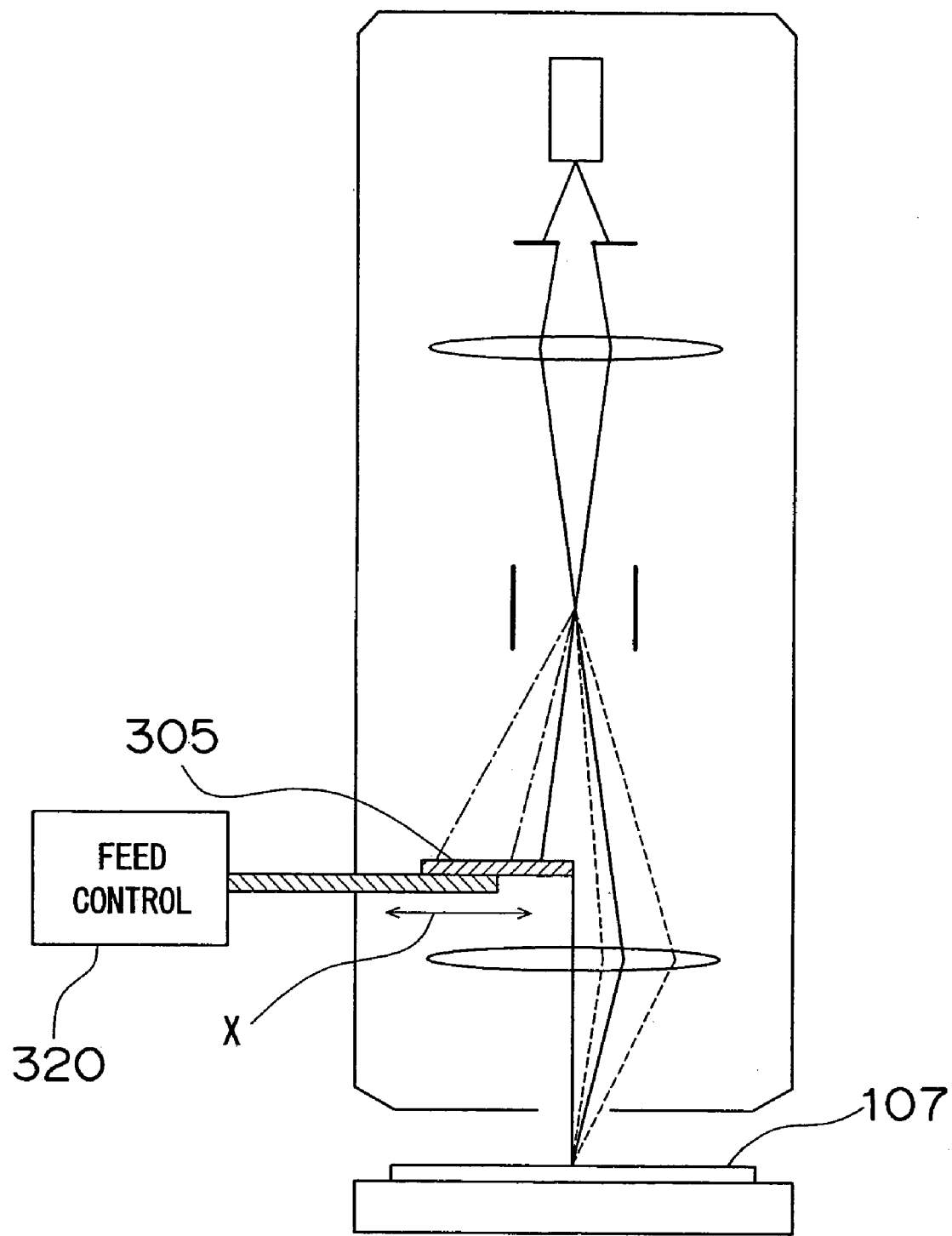
FIG. 8 is a view explanatory of the blanking process performed by travel of the blanking mask of FIG. 7.

Meanwhile, the transmission shape can be changed continuously. Thus, if the irradiation intensity of the electron beam is changed in accordance with radial position of exposure on the recording master 107 through association of the radial position of exposure on the recording master 107 with the transmission shape of the electron beam, exposure having a constant angular velocity of the rotary stage 108 can be performed. At this time, in order to change the transmission shape of the blanking mask 305 in accordance with the radial position of exposure on the recording master 107, the deflection direction based on the blanking deflector 104 may be changed. However, in this case, since control is complicated and this change of the deflection direction is not required to be performed at high speed. Thus, as shown in FIG. 8, the blanking mask 305 may be preferably provided with a feed control mechanism 320 for controlling position of the blanking mask 305 in accordance with the radial position of exposure such that the transmission shape is changed by moving the blanking mask 305 horizontally as shown by the arrow X.

(Fourth Embodiment)

Figure 10:
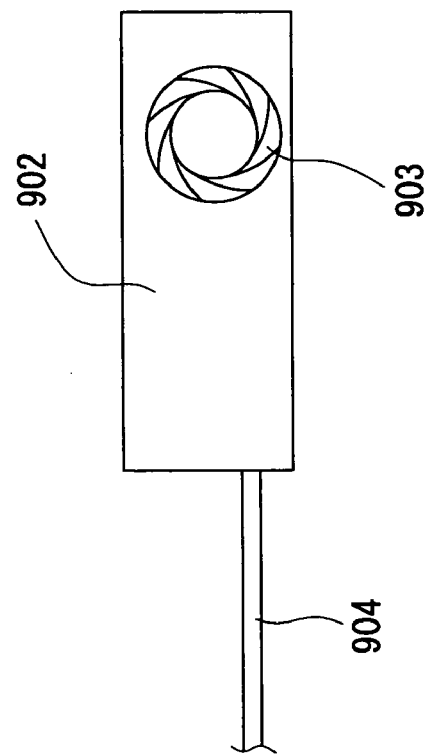
FIG. 10 is an enlarged top plan view showing an aperture employed in the electron beam exposure apparatus of FIG. 9.
Figure 9:
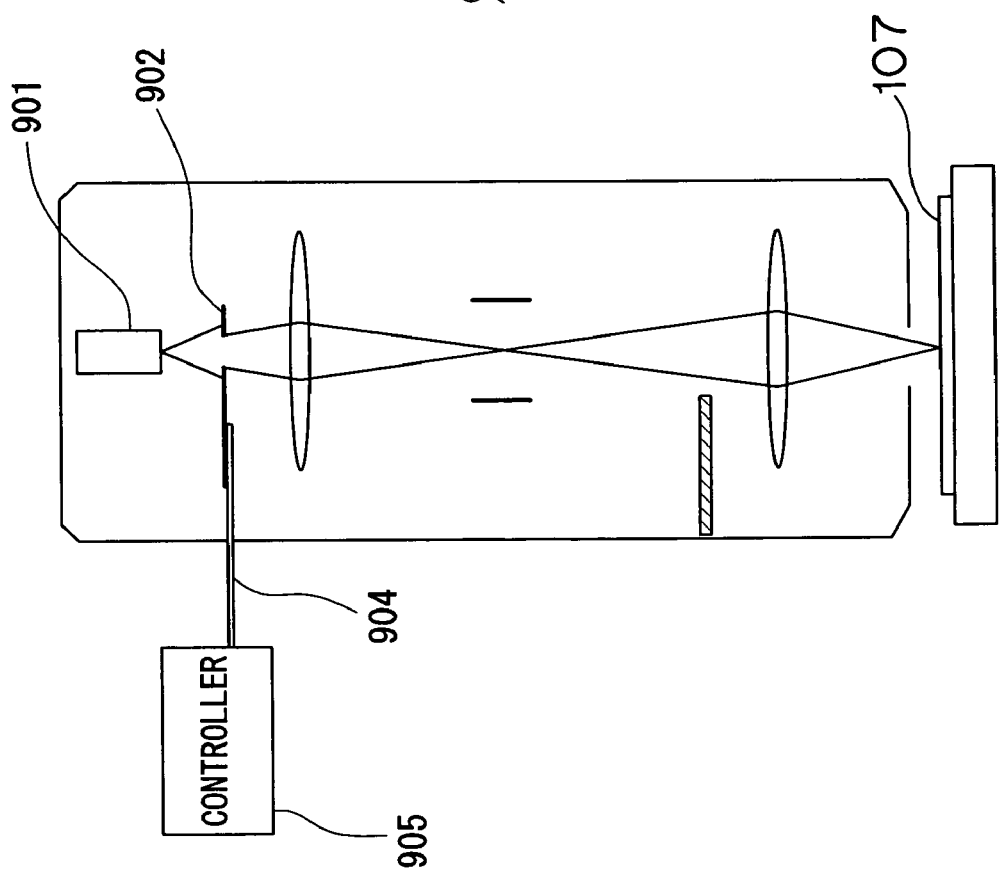
FIG. 9 is a schematic sectional view showing an electron beam exposure apparatus according to a fourth embodiment of the present invention.

FIG. 9 shows an electron beam exposure apparatus according to a fourth embodiment of the present invention and FIG. 10 shows an aperture 902 employed in the electron beam exposure apparatus of FIG. 9. In the fourth embodiment, irradiation intensity of the electron beam on the recording master 107 is controlled by changing in the aperture 902 a substantial transmission shape of the electron beam from an emitter 901. A principle of the electron beam exposure apparatus is fundamentally identical with that of the first embodiment.

As shown in FIG. 10, an aperture 902 has an opening formed by a stop blade 903 which can be opened and closed through, for example, a shaft 904. By using a controller 905 for controlling opening degree of the stop blade 903 in accordance with exposure radius of the recording master 107, irradiation intensity of the electron beam is changed continuously in accordance with the radial position of exposure on the recording master 107. In the case of, for example, a general optical disc having an outside diameter of 120 mm, the exposure radius ranges from 20 mm to 60 mm approximately. When exposure of the optical disc is performed from its inner periphery to its outer periphery, irradiation intensity is increased in proportion to the exposure radius such that irradiation intensity at an outer peripheral edge of the optical disc is about three times that at an inner peripheral edge of the optical disc. Exposure time for the single recording master 107 is at least one to two hours and irradiation intensity of the electron beam does not require high-speed change of, for example, 1 ms at all. In the method of the present invention, electron beam exposure having a constant angular velocity of the recording master 107, which has been hitherto impossible due to constant irradiation intensity, becomes possible.

Figure 11:
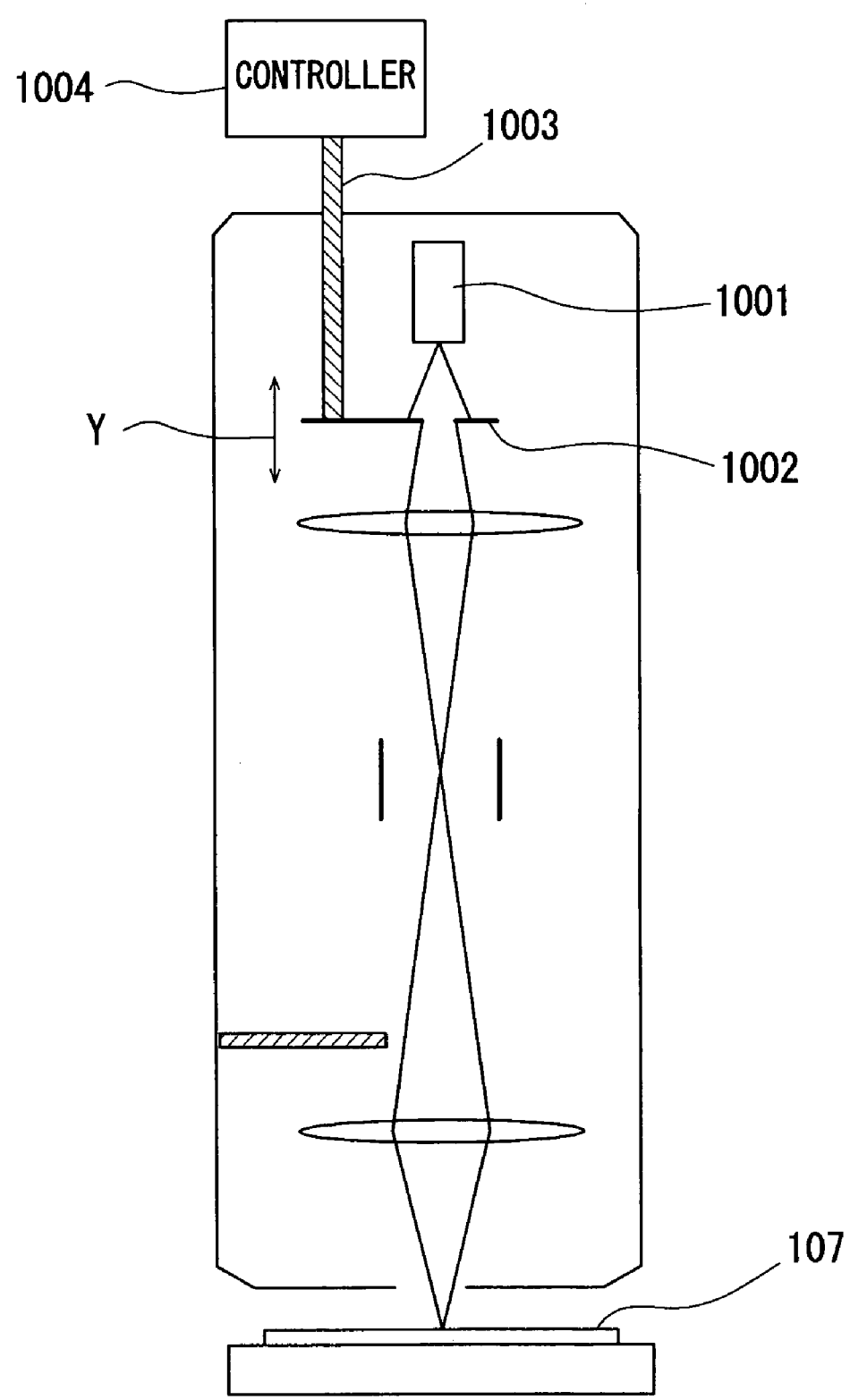
FIG. 11 is a schematic sectional view showing an electron beam exposure apparatus which is a first modification of the electron beam exposure apparatus of FIG. 9.
Figure 14:
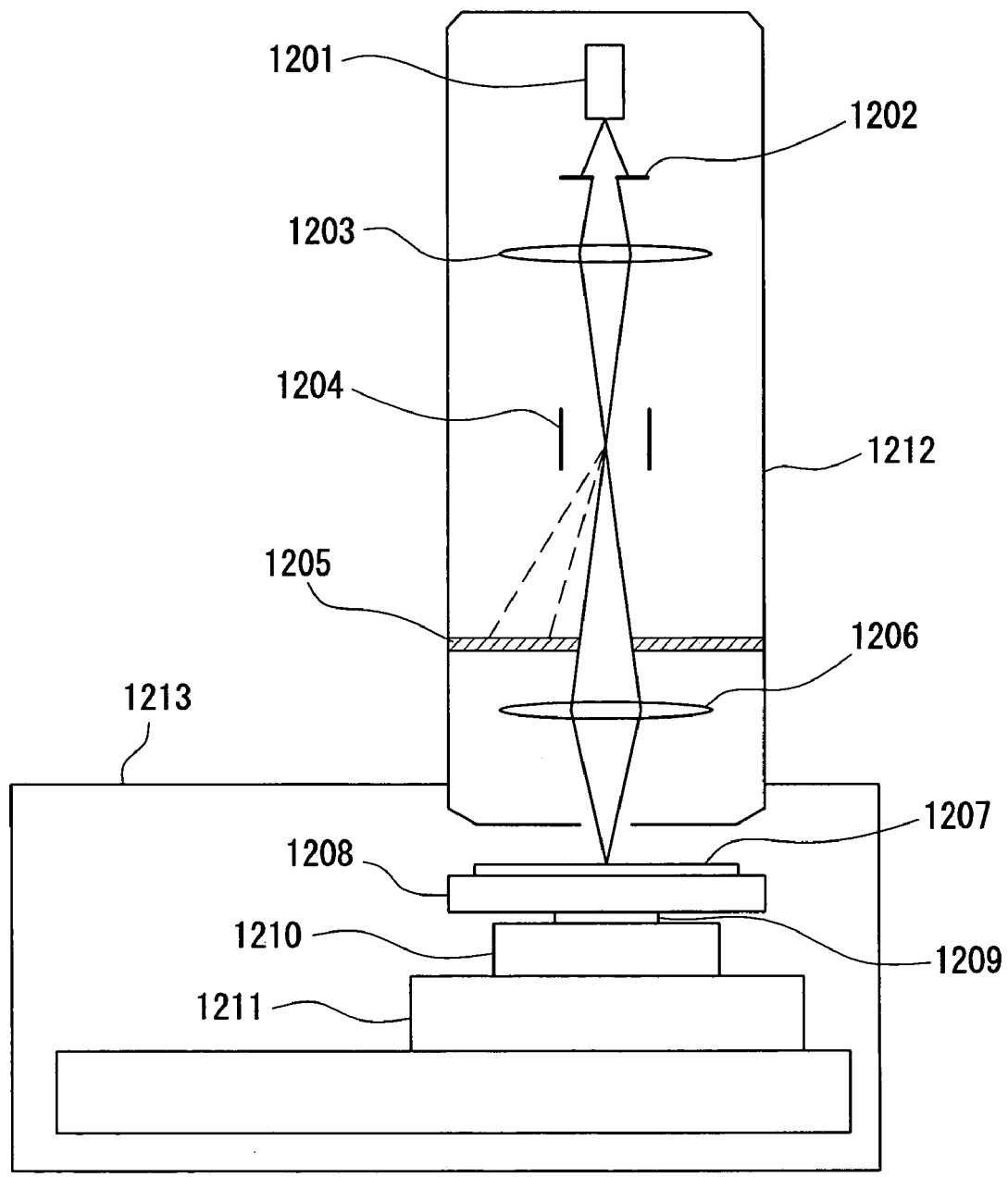
FIG. 14 is a schematic sectional view showing a prior art electron beam exposure apparatus.

In this embodiment, the transmission shape of the aperture 902 is controlled by employing the stop blade. As long as the transmission shape of the aperture 902 is changed continuously in accordance with exposure radius of the recording master 107, the method of the present invention is not restricted to that shown in FIGS. 9 and 10. For example, FIG. 11 shows an electron beam exposure apparatus which is a first modification of the electron beam exposure apparatus of FIG. 9, while FIGS. 12 and 13 show an electron beam exposure apparatus which is a second modification of the electron beam exposure apparatus of FIG. 9. In FIG. 11, a movable aperture 1002 is displaced vertically as shown by the arrow Y in accordance with exposure radius of the recording master 107 through a shaft 1003 by a controller 1004. In case the movable aperture 1002 is disposed at a location where the electron beam from an emitter 1001 does not form parallel pencil of rays, quantity of the electron beam restricted by the aperture 1002 can be substantially changed without changing shape of the aperture 1002 by displacing the aperture 1002 vertically. As a result, irradiation intensity of the electron beam can be changed continuously in accordance with exposure radius of the recording master 107. In FIGS. 12 and 13, an ordinary aperture 1101 and a movable aperture 1102 similar to the blanking mask 305 of the third embodiment are combined with each other and irradiation intensity of the electron beam can be changed continuously in accordance with exposure radius of the recording master 107 by moving the movable aperture 1102 horizontally as shown by the arrow Z in accordance with exposure radius of the recording master 107 by a controller 1103.

In the foregoing embodiments, the aperture 102 is disposed immediately below the emitter 101 as shown in, for example, FIG. 1. However, the aperture 102 is not necessarily required to be disposed immediately below the emitter 101 but may be disposed at any position suitable for shaping of the electron beam, for example, immediately above the blanking deflector 104 or immediately above the converging lens 106 for the recording master 107. Furthermore, in case the aperture 1102 for changing transmittance of the electron beam is used in combination with the ordinary aperture 1101 for shaping the electron beam as shown in FIG. 12, the aperture 1102 may be disposed at any position between the emitter 101 and the recording master 107 irrespective of shaping of the electron beam.

In electron beam exposure of the present invention in which the article subjected to exposure and the electron beam irradiation spot are moved relative to each other at a continuous speed, arbitrary control of irradiation intensity of the electron beam, which has been hitherto impossible, can be performed. As a result, not only long and short pit trains having an identical width can be formed by electron beam recording but information recording based on control of pit width and groove width and electron beam recording having a constant angular velocity can be performed.

The invention claimed is:

1. An electron beam exposure method in which an article subjected to exposure and an electron beam irradiation spot are moved relative to each other at a continuous speed;
wherein the article is exposed at a plurality of irradiation intensities of an electron beam by changing a transmittance of an electron optical system for forming the electron beam irradiation spot on the article,
the transmittance of the electron optical system is changed by changing a state of hitting of a blanking mask by the electron beam,
the state of hitting of the blanking mask by the electron beam is changed by controlling a state of deflection of the electron beam by a blanking deflector,
the state of deflection of the electron beam by the blanking deflector includes a first deflection state in which the electron beam is deflected in a first direction by the blanking deflector such that a whole of the electron beam hits the blanking mask, a second deflection state in which the electron beam is deflected in a second direction by the blanking deflector such that the electron beam does not hit the blanking mask at all and a third deflection state in which the electron beam is not deflected by the blanking deflector such that a portion of the electron beam hits the blanking mask.

2. The electron beam exposure method as claimed in claim 1, wherein the irradiation intensity obtained at the time a portion of the electron beam hits the blanking mask is not more than 97% of that obtained at a time a whole of the electron beam hits the blanking mask.

3. The electron beam exposure method as claimed in claim 1, wherein a plurality of transmission shapes of the electron beam are formed on the blanking mask such that the exposure is performed at a plurality of the irradiation intensities of the electron beam.

4. The electron beam exposure method as claimed in claim 3, wherein when a direction of deflection of the electron beam is changed continuously by a blanking deflector, the irradiation intensity of the electron beam changes discontinuously.

5. The electron beam exposure method as claimed in claim 3, wherein when a direction of deflection of the electron beam is changed continuously by a blanking deflector, the irradiation intensity of the electron beam changes continuously.

6. The electron beam exposure method as claimed in claim 3, wherein when the blanking mask is moved continuously, the irradiation intensity of the electron beam changes continuously.

7. The electron beam exposure method as claimed in claim 1, wherein a transmission shape of an aperture is changed continuously such that the irradiation intensity of the electron beam changes continuously.

8. The electron beam exposure method as claimed in claim 1, wherein after the exposure of the article, a pattern is formed on the article by one of wet etching and dry etching.

9. The electron beam exposure method as claimed in claim 1, wherein a chemically amplified resist layer is formed on the article.

10. The electron beam exposure method as claimed in claim 1, wherein one of a pit and a line or both of the pit and the line are formed spirally on the article by the exposure.

11. The electron beam exposure method as claimed in claim 1, wherein the article is used for manufacturing a master of an optical information recording medium.

* * * * *